(12) United States Patent
Nakao et al.

(10) Patent No.: US 7,108,537 B2
(45) Date of Patent: Sep. 19, 2006

(54) ELECTRICAL CONNECTOR HAVING LATCHING DEVICES

(75) Inventors: Kenzo Nakao, Furukawa (JP); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/026,070

(22) Filed: Dec. 30, 2004

(65) Prior Publication Data

US 2005/0260879 A1 Nov. 24, 2005

(30) Foreign Application Priority Data

May 24, 2004 (TW) ................. 93114598 A

(51) Int. Cl.
*H01R 13/625* (2006.01)
(52) U.S. Cl. .................................. 439/342
(58) Field of Classification Search ........... 439/342; 235/441
See application file for complete search history.

(56) References Cited

U.S. PATENT DOCUMENTS 6,450,824 B1 * 9/2002 Lemke et al. ............ 439/342
6,695,635 B1 * 2/2004 Lai ........................... 439/342

FOREIGN PATENT DOCUMENTS

CN 01255457.X 7/2002

* cited by examiner

*Primary Examiner*—Renee Luebke
*Assistant Examiner*—Vanessa Girardi
(74) *Attorney, Agent, or Firm*—Wei Te Chung

(57) ABSTRACT

An electrical connector electrically connecting an IC package to a printed circuited board comprises a base member (1), a cover member (2) moveably assembled over the base member, an actuator (3) driving the cover member to move over the base member and a plurality of terminals. The base member defines a plurality of receiving cavities (100) therethrough receiving terminals therein. The cover member defines pin mounting holes (200) corresponding to the receiving cavities of the base member. The base member comprises a head portion (13) and a main portion (14) and the cover member correspondingly comprises a side portion (23) and a leading portion (24) respectively. Latching devices, which are formed on the main portion and the leading portion of the base member and the cover member, each comprises a latching hole (5) and a hook (6) mating with the latching hole. Latching holes and hooks are formed on different ones of the base and the cover members. Each latching hole comprises an assembling portion (51) and a retaining portion (52) along a movement direction of the cover member, and a width of the assembling portion is larger than a width of the retaining portion.

9 Claims, 5 Drawing Sheets

ELECTRICAL CONNECTOR HAVING LATCHING DEVICES

BACKGROUND OF THE INVENTION

1. Field of the Invention

The present invention relates to an electrical connector, and particularly to an electrical connector having latching devices.

2. Description of Related Arts

A typical electrical connector connecting an IC package to a printed circuit board includes a plate-like base, a cover member and a plurality of terminals received in the base. The electrical connector is mounted on the printed circuit board, which has a plurality of conductive pads electrically connecting the terminals of the electrical connector, and the terminals also conductively contact the IC package mounted on the electrical connector, thus permit the interconnecting between the IC package and the printed circuit board.

To adapt the miniaturization of the computer's size, electrical connectors are designed to be smaller day after day, meanwhile the densities of the terminals are becoming much higher. It is becoming more and more important to accurately position the IC package to the electrical connector to ensure the reliability of transmission of electrical signals. Commonly, the cover member of electrical connector is driven by an actuator in a plane parallel to the underlying base, which makes the IC package, whose pins are received in the cover, interconnect with the terminals mounted on the base of the electrical connector without applying any insertion force to the pins of the IC package. It is noted that close coupling of the base and the cover is quite significant to make the better interconnection. However, in some cases, there are only some simple latching members formed on the head or the edges of the connectors. Because of the differences of the structure strength between the components coupling together, when distortion takes place in the base or cover of the electrical connector, the coupling of the base and cover is not quite steady, which may result in unreliable engagement between the terminals and the pins of the IC package. In addition, the transmission of electrical signals would be infected and it may lead to shut off electricity instantly.

Chinese Patent Application No. 01255457.X discloses an electrical connector having improved latching members. Hooks and corresponding latching holes formed on the head of an electrical connector latch with each other to dismiss the distortion which may take place when a cover of the electrical connector is driven by an actuator lever to move over the underlying base. However, the latching members formed only on the head of the electrical connector are not able to effectively eliminate the distortion after the cover and the base are securely coupled together. Furthermore, the same width of the latching holes may lead the hooks to get out from the latching holes while the cover is moving over the underlying base.

Hence, an electrical connector having improved lathing devices is desired.

SUMMARY OF THE INVENTION

Accordingly, an object of the present invention is to provide an electrical connector having improved latching devices for interconnecting the electrical connector and an IC package precisely and steadily.

To achieve the above object, an electrical connector in accordance with the present invention comprises a base member, a cover member moveably assembled over the base member, an actuator driving the cover member to move over the base member and a plurality of terminals. The base member defines a plurality of receiving cavities therethrough receiving terminals therein. The cover member defines pin mounting holes corresponding to the receiving cavities of the base member. The base member comprises a head portion and a main portion and the cover member correspondingly comprises a side portion and a leading portion respectively. Latching devices, which are formed on the main portion and the leading portion of the base member and the cover member, each comprises a latching hole and a protrusion mating with the latching hole. Latching holes and protrusions are formed on different ones of the base and the cover members. Each latching hole comprises an assembling portion and a retaining portion along a movement direction of the cover member, and a width of the assembling portion is larger than a width of the retaining portion.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
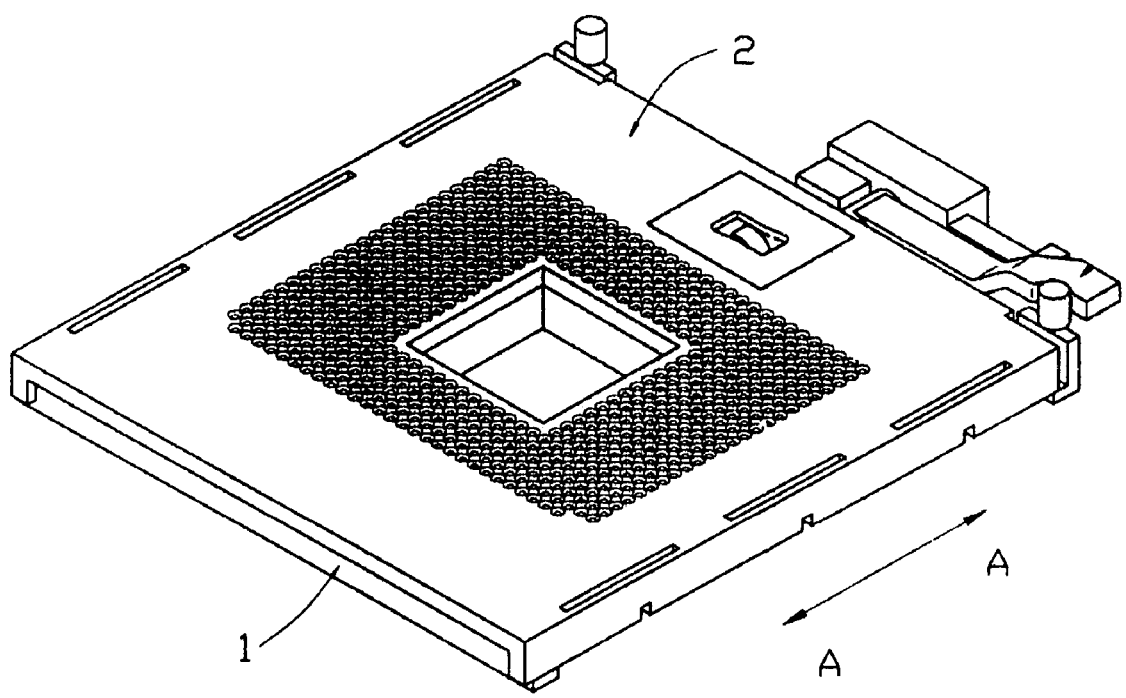
FIG. 1 is a perspective view of an electrical connector in accordance with the present invention.
Figure 2:
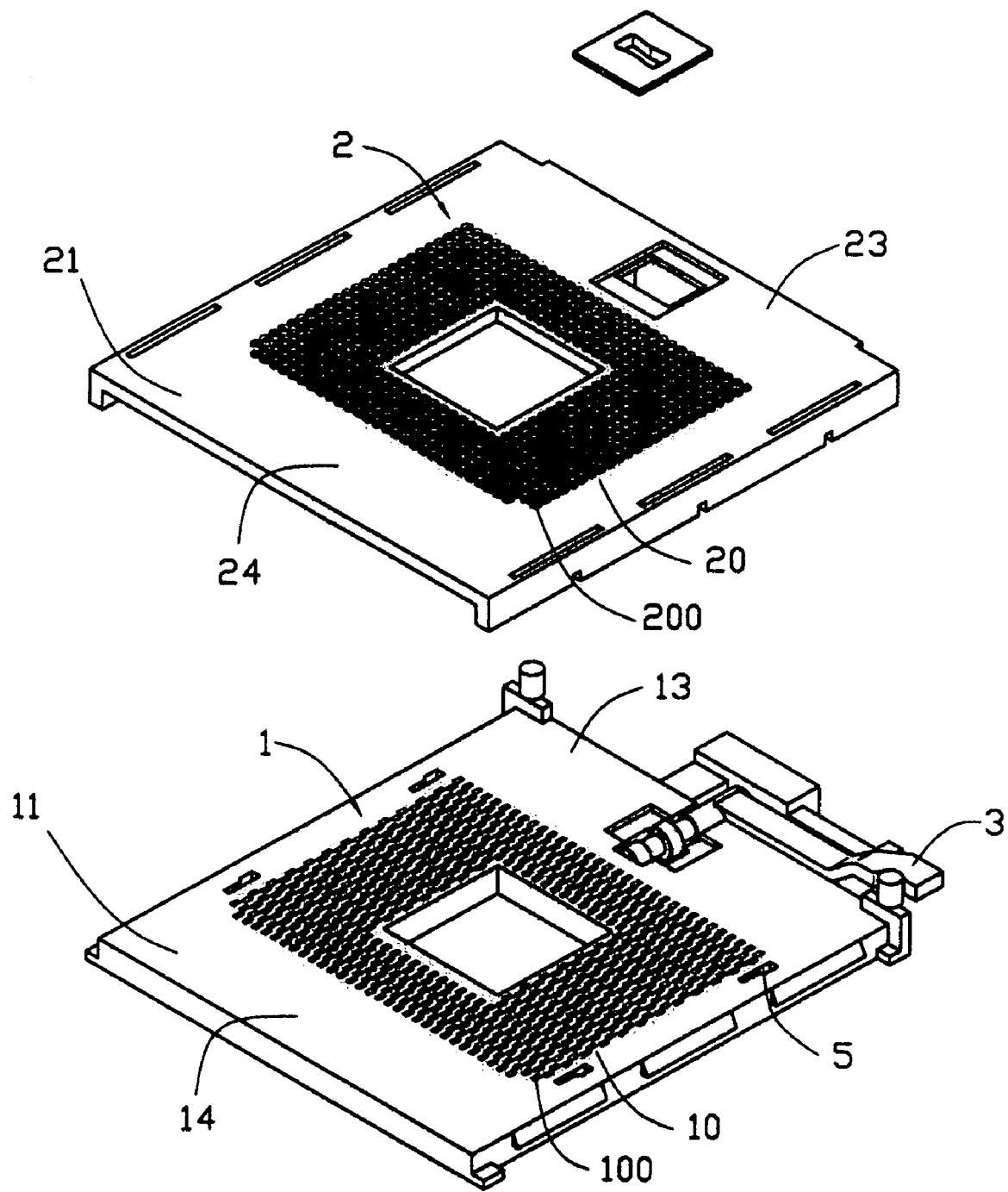
FIG. 2 is an exploded perspective view of the electrical connector of FIG. 1.

Referring to FIGS. 1–2, an electrical connector in accordance with the present invention comprises a plate-like base member 1, a cover member 2 overlying the base member 1, an actuator 3 and a plurality of terminals (not shown). The cover member 2 can reciprocate over the base member 1 along the double-arrowed line "A—A" driven by the operation of the actuator 3.

Figure 3:
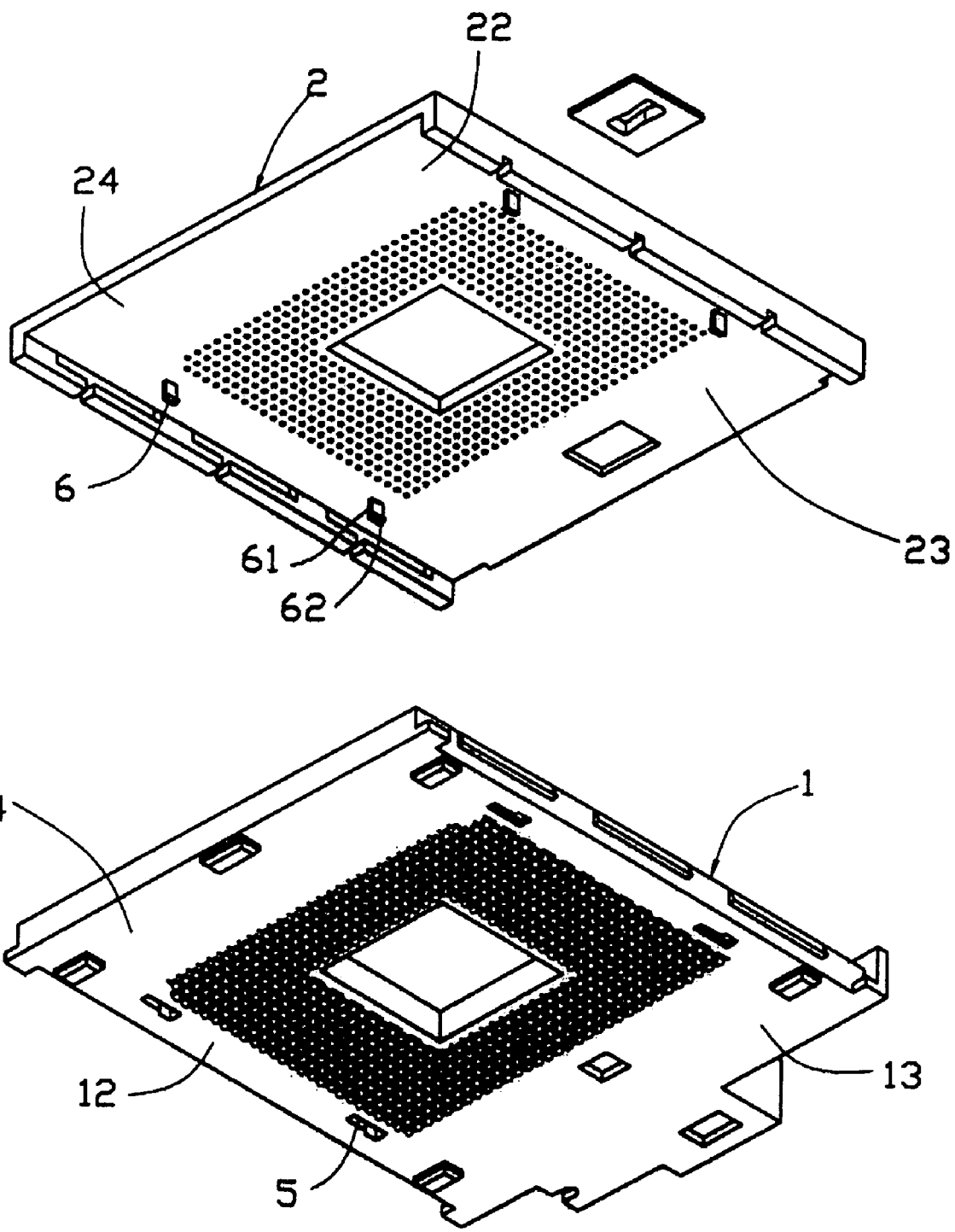
FIG. 3 is a view similar to FIG. 2, but taken from a different aspect.
Figure 4:
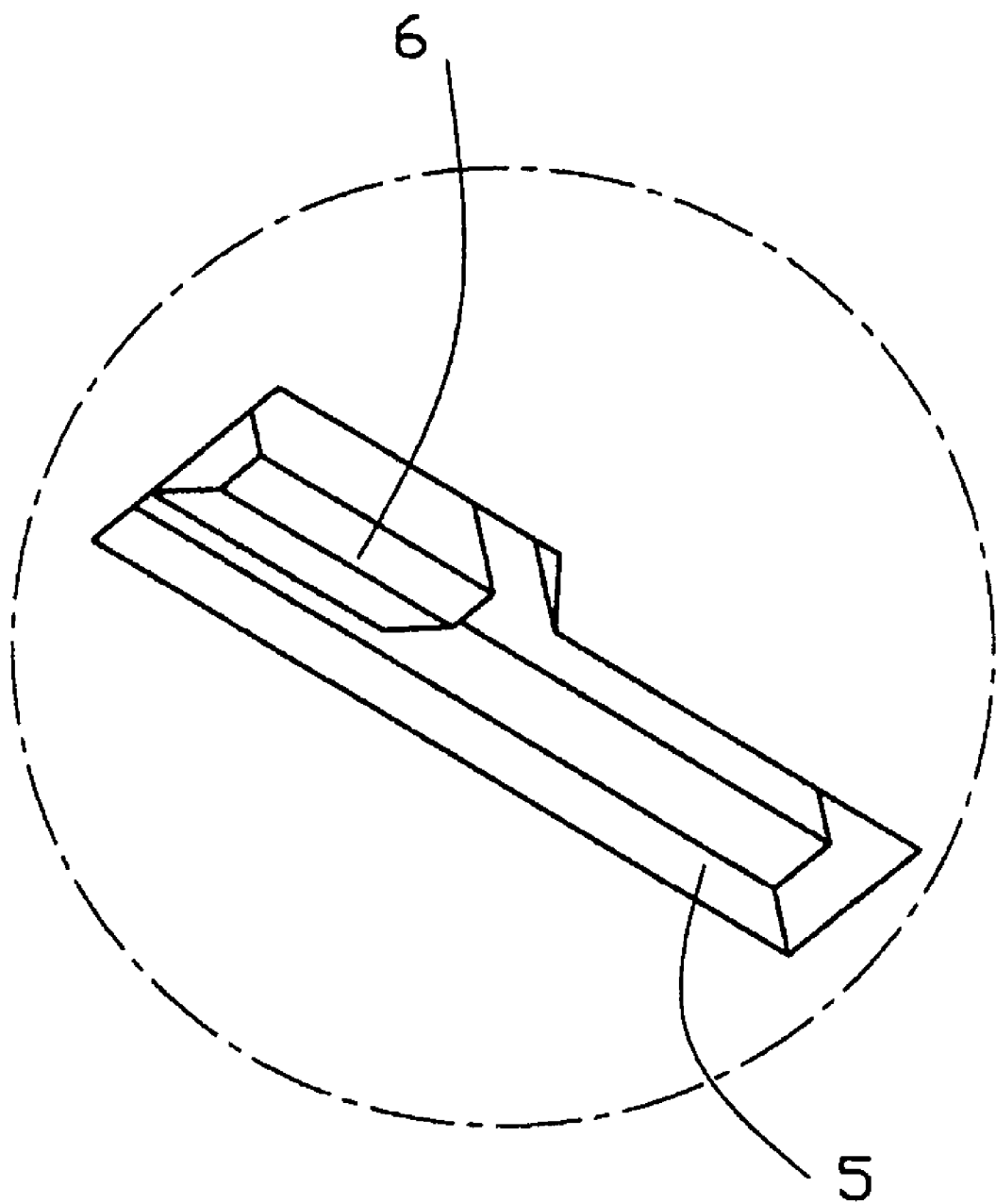
FIG. 4 is a partially enlarged view of the electrical connector of FIG. 1.
Figure 5:
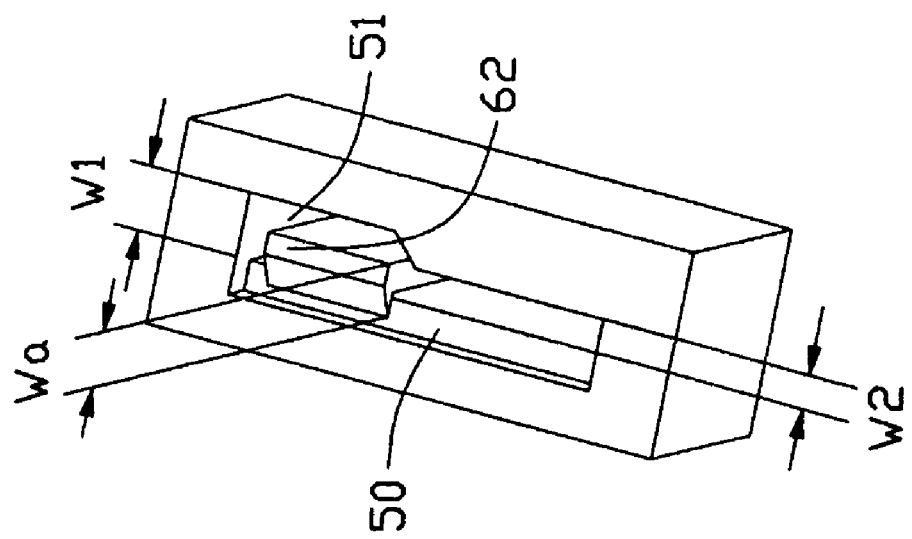
FIG. 5 is an assembled view of a hook engaging with a latching hole of the electrical connector in a first position.

Particularly referring to FIGS. 2–5, the base member 1 comprises a top surface 11 and a bottom surface 12 oppositely. The base member 1 comprises a terminal receiving area 10. A plurality of receiving cavities 100 are defined in the terminal receiving area 10 through the top surface 11 and the bottom surface 12 to receive the terminals therein. The base member 1 also comprises a head portion 13 and a main portion 14. On the main portion 13 defines elongated latching holes 5 along the slide direction of the cover member 2 throughout the base member 1. Each latching hole 5 has a latching face 50, which is higher than the bottom surface 12 of the base member 1, on one longitudinally lateral inside surface of the hole 5, as shown in FIG. 5. Each latching hole 5 comprises a first portion, in this embodiment being an assembling portion 51 with a width being W1, and a second portion, in this embodiment being a retaining portion 52 with a width being W2, and W1 is larger than W2. That is to say, the assembling portion 51 is wider than the retaining portion 52.

Referring to FIG. 2–3, the cover member 2 also comprises an upper surface 21 and a lower surface 22 oppositely. The upper surface 21 comprises a supporting portion 20 which is rectangular shaped as shown in this embodiment for supporting an IC package (not shown) thereon. A plurality of pin mounting holes 200 are defined in the supporting portion 20 through the upper surface 21 and the lower surface 22 to receive the pins of the IC package. The cover member 2 comprises a side portion 23 and a leading portion 24 corresponding to the head portion 13 and the leading portion 14 of the base member 1 respectively. Protrusions, in this embodiment being hooks 6, formed at the leading portion 24 extend downwardly from the lower surface 22 of the cover member 2. The hooks 6 and the aforementioned latching holes 5 are corresponding with each other so as to have good engagement as shown in FIG. 4. Each hook 6 includes an extending portion 61 and a fastening portion 62, and the fastening portion 62 comprises a fastening face (not labeled). In this embodiment, the extending portion 61 and the fastening portion 62 are configured as L-shaped. The fastening portion 62 extends from an end of and is wider than the extending portion 61. It is obvious that the length of the extending portion 61 of the hook 6 is the same as the distance between the latching face 50 and the bottom surface 12 of the base member 1, which assures firm retaining between the latching face 50 and the fastening face while the engagement of the hook 6 and latching hole 5.

In assembly, the IC package is assembled to the supporting portion 20 of the cover member 2, and the pins of the IC package are inserted into and extend out from the lower surface 22 of the cover member 2. Actuator 3 is installed to the head portions 13 and the side portion 23 of the base member 1 and the cover member 2. Force is applied to the actuator 3, therefore makes the cover member 2 move over the base member 1 from a first position, where the pins of the IC package are separate from the terminals of the electrical connector, to a second position, where aforementioned conductive contacts engage with each other.

Figure 7:
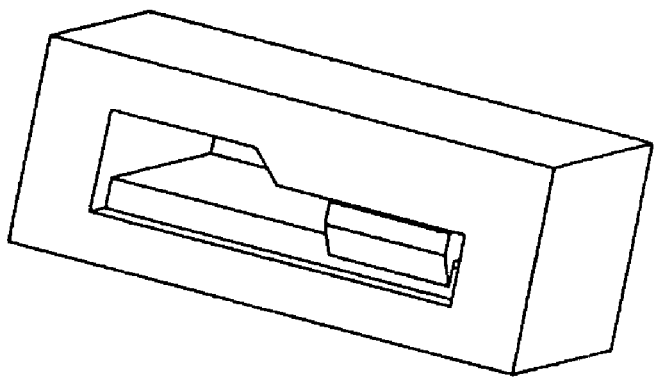
FIG. 7 is an assembled view of a hook engaging with a latching hole of the electrical connector in a second position.
Figure 6:
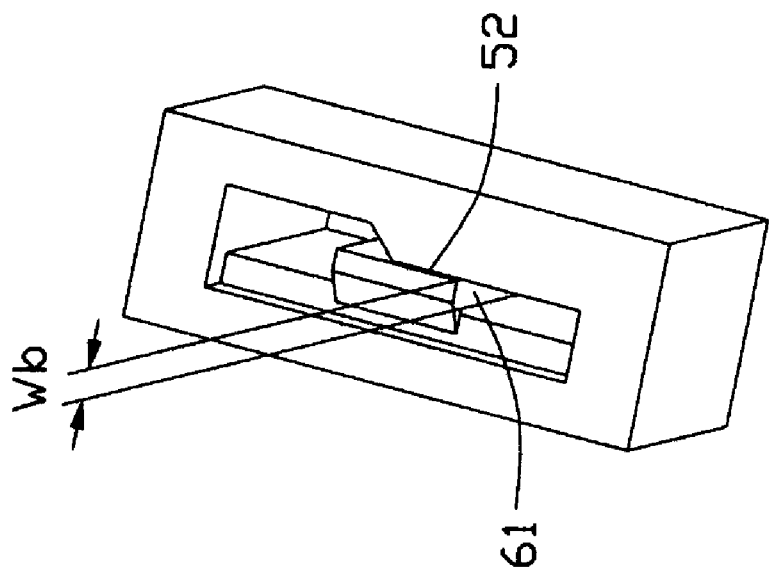
FIG. 6 is an assembled view of a hook engaging with a latching hole of the electrical connector in a middle position.

Specifically referring to FIGS. 5–7, each latching hole 5 and each corresponding hook 6 together form a set of latching device. Thickness of the fastening portion 62 is Wa, which is less than the width W1 of the assembling portion 51, and a little larger than the width W2 of the retaining portion 52. And thickness of the extending portion is Wb, which is less than Wa, whereas nearly the same as or more exactly say is even a little less than W2. Therefore, each fastening portion 62 can pass through corresponding latching hole 5 to get into the assembling portion 51 without any difficulty and let the fastening face mate with the latching face 50 of the latching hole 5 (as shown in FIG. 5). At this time, each hook 6 is in its first position and the engagement between the fastening face and the latching face 50 is very loose. As the cover member 2 slides along the base member 1, each hook 6 of the cover member 2 is pushed from the assembling portion 51 to the retaining portion 52 along the latching face 50 (as shown in FIG. 6) by the force applied on the actuator 3, regardless of a little less size of the width W2 of retaining portion 52 than the thickness Wb of the extending portion 6. The movement direction of the hook 6 is parallel to that of the cover member 2. In the end, each hook 6 is pushed to its second position and each fastening portion 62 of the hook 6 is entirely retained in the retaining portion 52 (as shown in FIG. 7), with each fastening face of the hook 6 tightly engaging with each latching face 50 of latching hole 5, so they are well latched with and not easy to be separated from each other. In this manner, the base member 1, cover member 2 and the IC package are interconnected tightly and steadily.

In another embodiment of the present invention, the hooks 6 can extend upwardly from the top surface 12 of the base member 1, and the latching holes 5 can be formed on the cover member 2 corresponding to aforementioned hooks 6. The latching mechanism is the same as the first embodiment and can also achieve the object of the present invention.

It is noted that the electrical connector of present invention comprises hooks 6 and latching holes 5 at the main portion 13 and leading portion 23 of the base member 1 and cover member 2, which can effectively avoid distortion that may occur while the engagement of the cover member 2 and base member 1 of the electrical connector. The different widths of different portions in one latching hole 5 can prevent hook 6 from getting off, as the cover member 2 moves over the base member 1, to make them latch with each other better and have better electrical connecting between the IC package and the electrical connector.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector, comprising:
   a base member defining a plurality of receiving cavities therethrough receiving terminals therein;
   a cover member moveably assembled over the base member and defining pin mounting holes corresponding to the receiving cavities of the base member;
   an actuator driving the cover member to move over the base member; and
   latching devices disposed between the base member and the cover member, each latching device comprising a latching hole and a protrusion mating with the latching hole, the latching hole being defined in the base member, and the protrusions being formed on the cover member, the base member comprises a top surface and a bottom surface, the latching hole extends through the top surface and the bottom surface; each latching hole comprising a first portion and a second portion along a movement direction of the cover member, and a width of the first portion being larger than a width of the second portion wherein the latching hole comprises a latching face higher than a bottom surface of the base member.

2. The electrical connector as described in claim 1, wherein the cover member comprises an upper surface and a lower surface, each protrusion comprises an extending portion extending downwardly from the lower surface and a thickness of the extending portion is less than the width of the first portion and larger than the width of the second portion.

3. The electrical connector as described in claim 2, wherein a length of the extending portion is the same as a distance between the latching face and the top surface of the base member.

4. The electrical connector as described in claim 3, wherein each protrusion comprises a fastening portion extending from an end thereof and being wider than the extending portion, each fastening portion comprises a fastening face for engaging with the latching face of the latching hole.

5. An electrical connector, comprising:
- a base member defining a plurality of receiving cavities therethrough receiving terminals therein;
- a cover member moveably assembled over the base member and defining pin mounting holes corresponding to the receiving cavities of the base member;
- an actuator driving the cover member to move over the base member; and
- latching devices disposed between the base member and the cover member, each latching device comprising a latching hole and a protrusion mating with the latching hole, the latching hole being defined in the cover member, and the protrusions being formed on the base member, each latching hole comprising a first portion and a second portion along a movement direction of the cover member, and
- a width of the first portion being larger than a width of the second portion; wherein
- the latching hole comprises a latching face higher than a bottom surface of the base member.

6. The electrical connector as described in claim 5, wherein the cover member comprises an upper surface and a lower surface, the latching hole extends through the upper surface and the lower surface.

7. The electrical connector as described in claim 6, wherein the base member comprises a top surface and a bottom surface, each protrusion comprises an extending portion extending upwardly from the top surface and a thickness of the extending portion is less than the width of the first portion and larger than the width of the second portion.

8. The electrical connector as described in claim 7, wherein a length of the extending portion is the same as a distance between the latching face and the lower surface of the cover member.

9. The electrical connector as described in claim 8, wherein each protrusion comprises a fastening portion extending from an end thereof and being wider than the extending portion, each fastening portion comprises a fastening face for engaging with the latching face of the latching hole.

\* \* \* \* \*